(12) United States Patent　(10) Patent No.:　　US 6,323,048 B1
Chevallier　　　　　　　　　　　　(45) Date of Patent:　　Nov. 27, 2001

(54) INTEGRATED CIRCUIT PROBE PAD METAL LEVEL

(75) Inventor: Christophe J. Chevallier, Palo Alto, CA (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/652,618

(22) Filed: Aug. 31, 2000

Related U.S. Application Data

(62) Division of application No. 08/996,639, filed on Dec. 22, 1997, now Pat. No. 6,140,665.

(51) Int. Cl.⁷ .................................................. H01L 21/66
(52) U.S. Cl. .............................. 438/14; 438/17; 438/612; 438/622; 438/637
(58) Field of Search ........................... 438/612, 622, 438/637, 14, 17

(56) References Cited

U.S. PATENT DOCUMENTS

| 3,302,076 | 1/1967 | Kang et al. ........................... 317/234 |
| 3,303,059 | 2/1967 | Kerr et al. ............................ 148/1.5 |
| 3,961,358 | 6/1976 | Polinsky ............................... 357/53 |
| 4,288,911 | 9/1981 | Ports ................................... 29/574 |
| 5,284,797 | * 2/1994 | Heim ................................... 438/612 |
| 5,391,892 | 2/1995 | Devereaux et al. .................... 257/48 |
| 5,436,183 | * 7/1995 | Davis et al. .......................... 438/612 |
| 5,444,012 | * 8/1995 | Yoshizumi et al. .................. 438/622 |
| 5,593,903 | * 1/1997 | Beckenbaugh et al. .............. 438/612 |

FOREIGN PATENT DOCUMENTS 6-5671　6/1992　(JP) ............................... H01L/21/66

\* cited by examiner

*Primary Examiner*—T. N. Quach
(74) *Attorney, Agent, or Firm*—Schwegman, Lundberg, Woessner & Kluth, P.A.

(57) ABSTRACT

An integrated circuit is described which includes a metal level primarily comprising probe pads for testing the integrated circuit. This additional metal level is isolated from the integrated circuit upper metal level by an insulating layer. This probe metal level is selectively connected to the metal level and other regions of the integrated circuit to form electrical connections. The probe metal level allows for accurate and extensive pre-production testing of the integrated circuit without sacrificing valuable real-estate of the metal level. The probe metal level and the insulating layer are described as useful during pre-production phases and are preferably eliminated during production of the integrated circuit.

51 Claims, 6 Drawing Sheets

INTEGRATED CIRCUIT PROBE PAD METAL LEVEL

This application is a divisional of U.S. application, Ser. No. 08/996,639, filed on Dec. 22, 1997, U.S. Pat. No. 6,140,665.

TECHNICAL FIELD OF THE INVENTION

The present invention relates generally to integrated circuits and in particular the present invention relates to an integrated circuit metal probe pad layer.

BACKGROUND OF THE INVENTION

Modern integrated circuit technology uses multiple layers of material to create an operational circuit. Successive layers of insulating, conducting, and semiconducting materials are patterned to form a structure that performs a specific function. The structure is typically linked with surrounding areas and subsequent layers. As known to those in the art, an integrated circuit is typically fabricated using a silicon substrate which can be selectively doped by diffusing impurities into the silicon to create active regions. Additional layers are located above the substrate to form a three dimensional circuit. These layers can be fabricated through numerous techniques, including deposition of semiconductors or insulators, and growth of epitaxial layers. These layers are processed using photolithography, ion implantation, mask and etching processes, and other known techniques such as chemical-mechanical polishing (CMP) to form active and passive components.

To inter-connect the integrated circuit structures, and couple the components to external devices, one or more layers of metal are provided. These metal levels are generally referred to as metal-one and metal-two, in a two metal fabrication process. The metal-two layer is the uppermost metal level, and contains bonding pads for connection to external nodes. The lower metal layer does not contain bonding pads, as accessing this layer for bonding a wire would not be possible, or would require extra manufacturing steps.

Following patterning of the final metal level, a passivation layer is deposited over the entire top surface of the integrated circuit. This passivation layer is an insulating, protective layer that prevents mechanical and chemical damage during assembly in packaging of the integrated circuit. A probe pad and bonding contact mask is used to define patterns corresponding to areas in which electrical contact to the finished integrated circuit will be made. These patterns allow openings to be formed in the passivation layer for access to both bonding pads and probe pads.

During the development of an integrated circuit, it is often necessary to physically access internal nodes of the circuit to verify proper functionality of the circuitry, or to determine which circuitry has failed. It is also sometimes useful to force a voltage level on an internal node to check the behavior of circuitry affected by that node. Traditionally, external nodes are connected through large bond pads, typically square of 100 um side, on which a wire can be bonded. On earlier technologies, with lithography down to 1 um, it was possible to probe a metal line using mechanical devices with a very fine tip and fine position adjustments. With such devices, it was usually possible to put a probe tip on a one micron wide line, even though this requires a very careful set-up. This type of mechanical alignment is not possible with technologies which use smaller lithography. In these devices, nodes which are desired to be checked are identified and small probe pads are designed for fabrication in the integrated circuit. Such pads typically are at least 5 microns on a side. Including these probe pads can substantially affect the size of an integrated circuit. Thus, valuable integrated circuit real estate must be dedicated to fabricating probe pads. During the production of the integrated circuit, a majority of the probe pads are typically not necessary. That is, the probe pads are primarily useful during pre-production testing of the integrated circuit to verify improper operation of internal circuitry, and for troubleshooting defects identified during testing.

For the reasons stated above, and for other reasons stated below which will become apparent to those skilled in the art upon reading and understanding the present specification, there is a need in the art for testing integrated circuits during pre-production testing while minimizing integrated circuit real estate dedicated to probe pads during production. Further, there is a need in the art for an integrated circuit which provides access to internal nodes without increasing the production integrated circuit die area.

SUMMARY OF THE INVENTION

The above mentioned problems with integrated circuits and other problems are addressed by the present invention and which will be understood by reading and studying the following specification. An integrated circuit is described which includes a metal level which is primarily comprised of probe pads.

In particular, the present invention describes an integrated circuit comprising a first metal level substantially comprising a plurality of wire bonding pads and conductor lines, an insulating level located on a top surface of the first metal level, and a metal probe level located on a top surface of the insulating level and substantially comprising a plurality of electrical probe pads.

In another embodiment, a method of fabricating an integrated circuit is described. The method comprises the steps of fabricating a first metal conductor layer substantially comprising a plurality of wire bonding pads and conductor lines, fabricating an insulating level on a top surface of the first metal level and covering the plurality of wire bonding pads and conductor lines, providing access locations through the insulating level to provide access to the first metal level, and fabricating a metal probe level on a top surface of the insulating level, the metal probe level substantially comprising a plurality of electrical probe pads.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention allows for extensive pre-production testing of an integrated circuit using probe pads while eliminating the need to include excessive probe pads in production integrated circuits. An additional metal level is provided which includes primarily probe pads coupled to regions of the integrated circuit through contacts. This additional metal level can also include short metal conductive runs to allow for convenient and patterned locations of the probe pads. By providing this additional metal level extensive testing can be conducted on the integrated circuit during pre-production processes. The present invention comprises an integrated circuit which includes a metal level which provides probe pads which are eliminated during processing. One type of integrated circuit which is well suited to benefit from the described metal level is an integrated memory device. The memory device can be any configuration, including but not limited to DRAM, SRAM, EEPROM, and Flash EPROM. Prior to describing the metal probe layer, a brief description is provided of a Flash memory. The flash memory allows for probe pads to be located on top of a memory array. This is not possible without the extra metal layer of the present invention.

Flash Memory

Figure 1A:
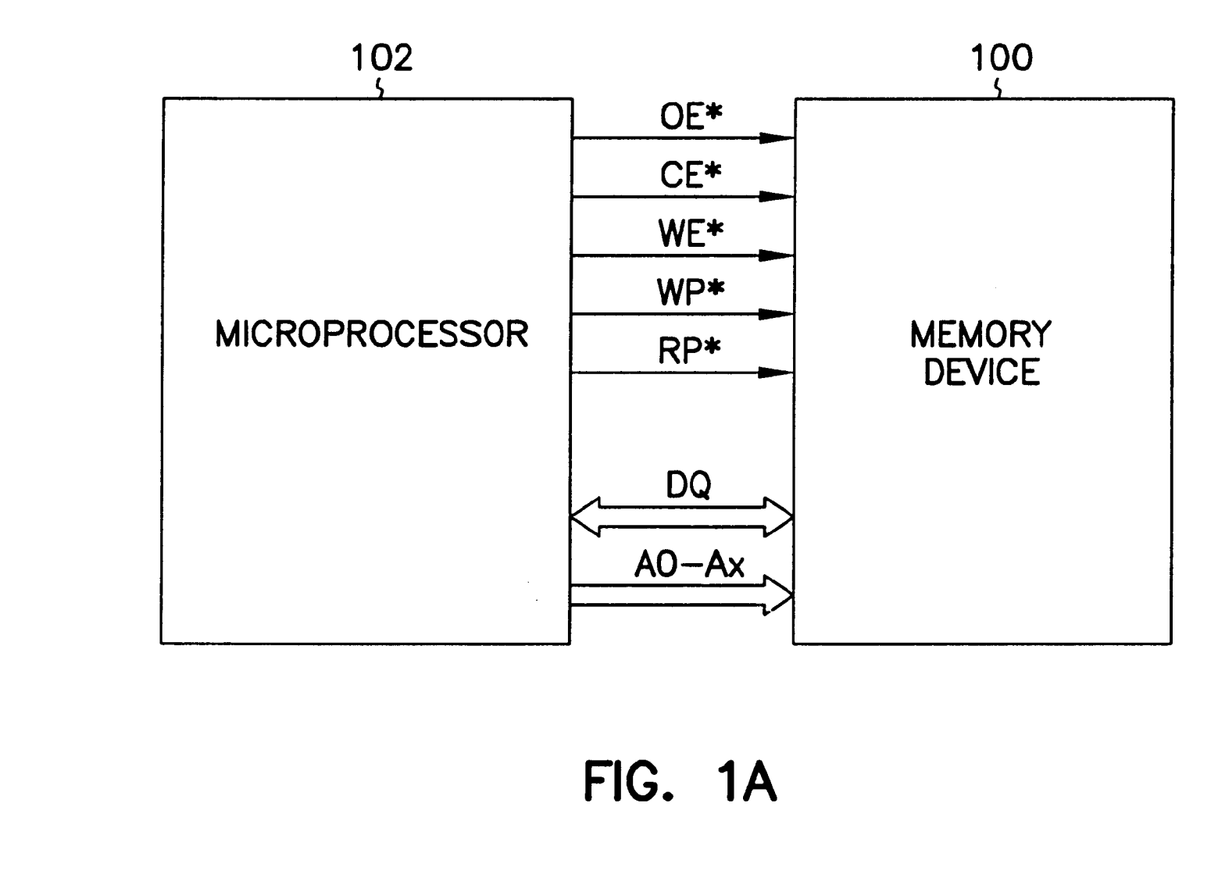
FIG. 1A is a block diagram of a flash memory incorporating the present invention.

FIG. 1A illustrates a block diagram of a basic Flash memory device 100 which is coupled to a microprocessor, or memory controller 102. The memory device has been simplified to focus on features of the memory which are helpful in understanding the present invention. The memory device 100 includes an array of non-volatile memory cells 104. The memory cells are preferably floating gate memory cells. The array is arranged in rows and columns, with the rows arranged in blocks. The blocks allow memory cells to be erased in blocks. Data, however, is stored in the memory array separate from the block structure. Erase operations, therefore, are performed much faster.

Figure 1B:
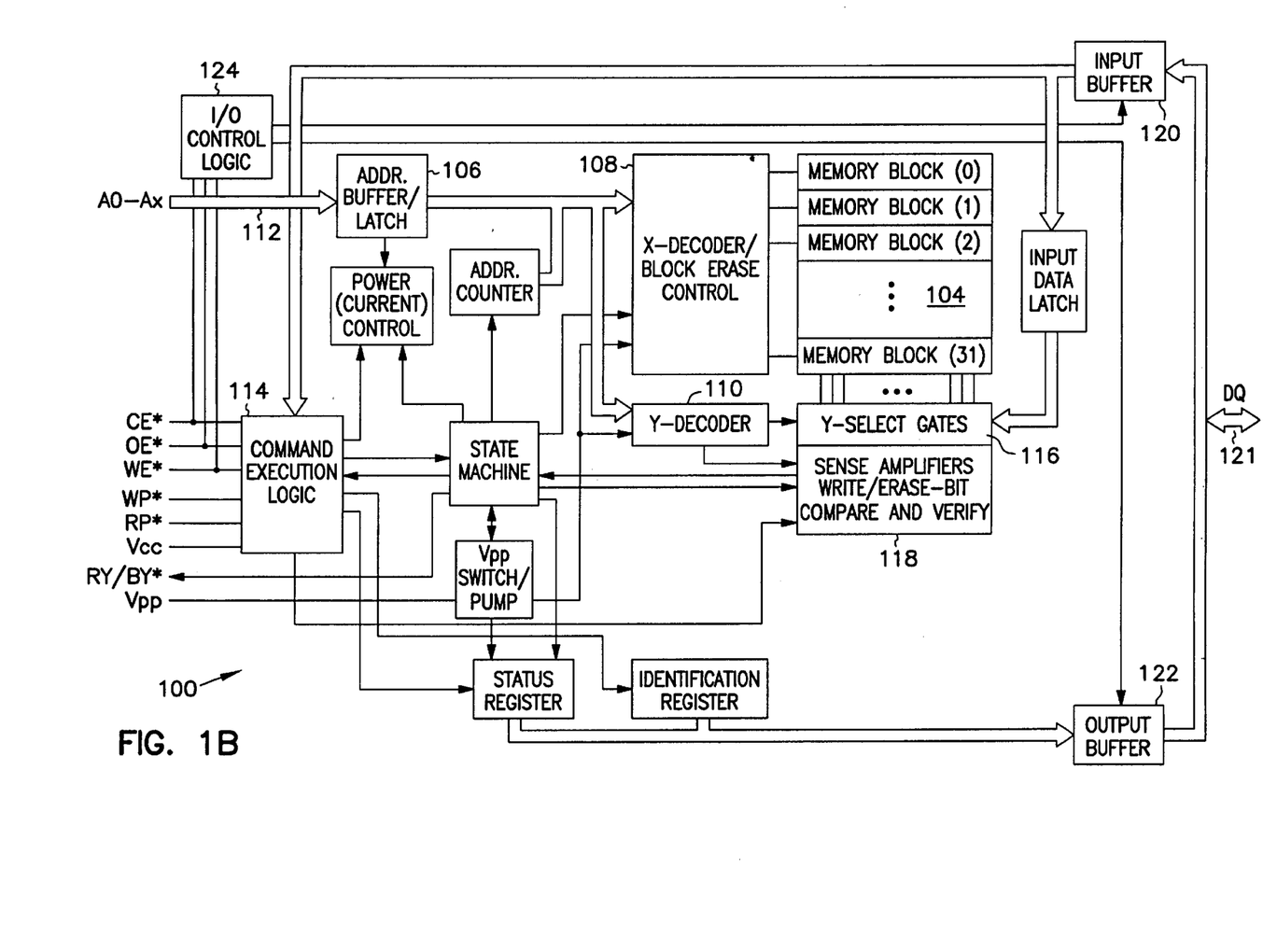
FIG. 1B is a more detailed illustration of the memory of FIG. 1A.

Referring to FIG. 1B, a An x-decoder 108 and a y-decoder 110 are provided to decode address signals provided on address lines A0-Ax 112. An address buffer circuit 106 is provided to latch the address signals. Address signals are received and decoded to access the memory array 104. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The memory includes an internal circuitry in command control circuit 114 for generating timing signals. As stated above, the Flash memory of FIGS. 1A and 1B has been simplified to facilitate a basic understanding of the features of the memory. A more detailed understanding of Flash memories is known to those skilled in the art. See "1997 Flash Memory Data Book" pages 2–5 to 2–33 available from Micron Quantum Devices, Inc. (incorporated herein by reference) for a more detailed description of a Flash memory.

Typical flash memories comprise a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

Flash memories have typical read operating voltages of about 5 volts maximum. A high voltage, however, is usually required for programming and erase operations in a flash memory. This high voltage (Vpp) is typically in the range of 10 to 13 volts, but can be higher. During a programming operation, electrons are injected onto the floating gate by applying the high voltage (Vpp) to the control gate and about one-half Vpp to the drain region while the source region is grounded. Electron tunneling from the floating gate during an erase operation is accomplished by applying Vpp to the source region, connecting the control gate to ground potential and leaving the drain region electrically unconnected or floating.

Integrated Circuit Metal Probe Pad Layer

The present invention provides an integrated circuit which includes a "sacrificial" metal level that can be used during pre-production testing of the integrated circuit but not have to be included during production of the integrated circuit. That is, the sacrificial metal level can be eliminated once the integrated circuit is in production. This metal level can also be fabricated during production if desired, as described below.

Figure 2:
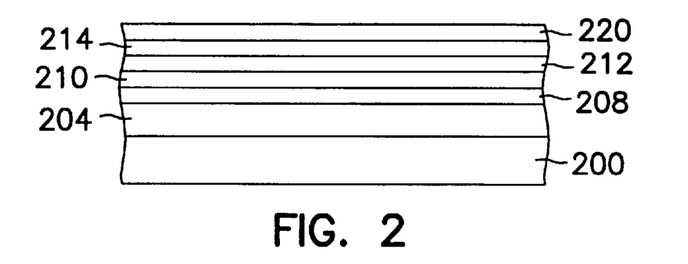
FIG. 2 is a cross-section of an integrated circuit of the present invention.

Referring to FIG. 2, a cross section of a typical integrated circuit such as a flash memory is described which incorporates the present invention. The integrated circuit includes a base layer 200, or substrate, on which the integrated circuit is fabricated. It will be appreciated that the base layer forms an integral part of the integrated circuit and can contain active devices. Layers of insulators, semiconductors, and conductors are formed above the base layer. These different layers are generally illustrated in FIG. 2 as region 204. At least one metal level 212 is provided for electrically connecting isolated regions of the integrated circuit together, and providing bonding pads for electrically connecting the integrated circuit to external connections. Thus, level 212 substantially comprises wire bonding pads and conductor lines.

The integrated circuit of FIG. 2 includes two metal levels 208 and 212. The lower metal level 208, or metal-one, is isolated from the upper metal level 212, or metal-two, by an insulating layer 210. Contacts (not shown) are provided through this insulating layer to allow portions of the metal-two level to contact the metal-one level. A passivation layer (not shown) would normally be located on the top surface of the metal-two level to protect the integrated circuit and the metal-two level.

For pre-production integrated circuits, an insulating layer 214 is provided on top of the metal-two level. A third metal level 220, probe metal, is provided on top of the insulating layer. Thus, the metal probe level is located on a top surface of the insulating level and substantially comprises electrical probe pads. The insulating layer is patterned and etched to provide contacts between the metal-two level and the probe metal level. Further, additional contacts can be provided to the metal-one level, or other regions of the integrated circuit. The probe metal level is patterned using a mask to define primarily probe pads. As such, the upper most metal level of the integrated circuit does not primarily contain bonding pads or conductor lines, and is not protected using a passivation layer. Any metal suitable for use in an integrated circuit can be used for the probe metal level. Likewise, the insulating level can be any suitable insulator, such as a layer of oxide.

Figure 3:
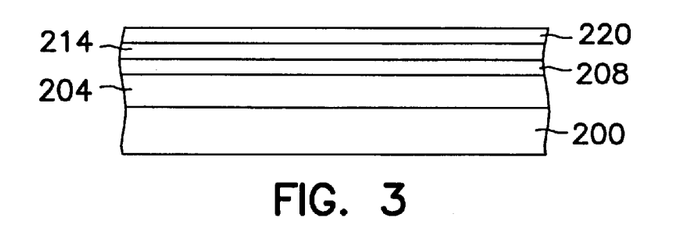
FIG. 3 is a cross-section of an alternate embodiment of an integrated circuit of the present invention.

The integrated circuit illustrated in FIG. 2 allows for more accurate pre-production testing of the integrated circuit than probing conductors of prior integrated circuits. That is, prior integrated circuits can not be probe extensively without eliminating the passivation layer to allow contact to be made to various locations of the upper metal level. By eliminating the passivation layer, the electrical characteristics and operation of the integrated circuit are changed. By providing the additional insulating layer and the probe metal level, the electrical characteristics and operation of the integrated circuit during pre-production testing more closely predicts actual production integrated circuit operation. FIG. 3 illustrates an alternate embodiment of the present invention which includes a single metal level fabrication, but also benefits from the inclusion of the probe metal level. Regardless of the integrated circuit design, it is anticipated that the probe metal level 220 and additional insulating layer 214 will be eliminated during production of the integrated circuit, and a passivation level substituted therefore. However, the probe metal level can include bond pads and be included in the production integrated circuit.

Figure 4:
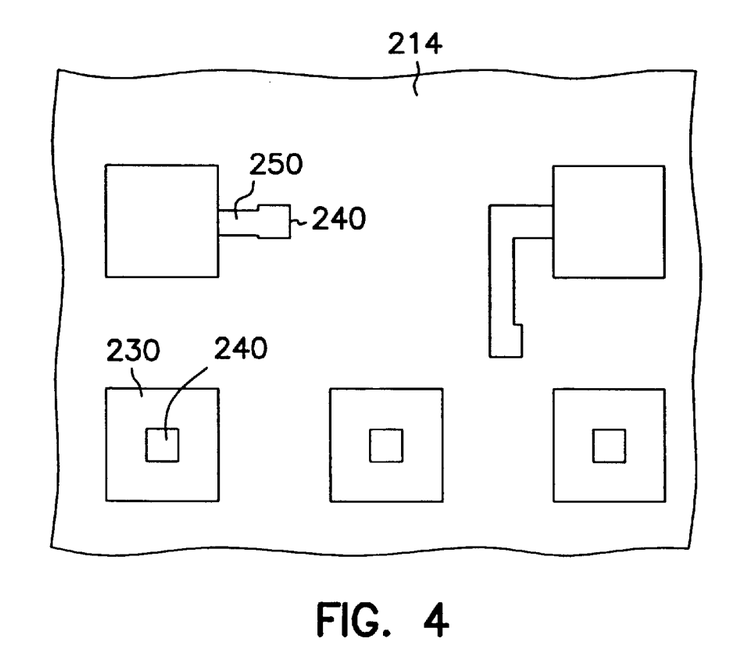
FIG. 4 is a plan view of a portion of an integrated circuit probe metal level.

FIG. 4 is a plan view of a portion of an integrated circuit probe metal level 220. The metal level includes numerous probe pads 230 arranged to vertically align with contacts 240 through the insulating layer 214. When vertical alignment is not possible, short conductors 250 can be provided to horizontally offset a probe pad and contact.

Figure 5A:
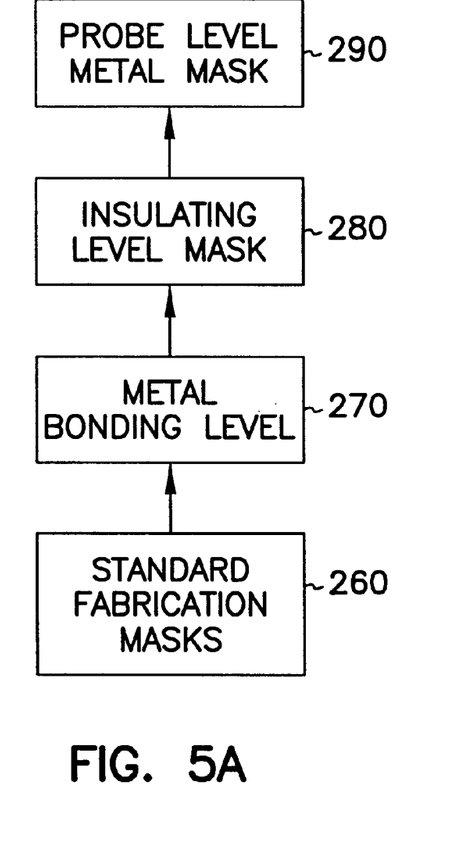
FIG. 5A illustrates a simplified pre-production flow diagram.
Figure 5B:
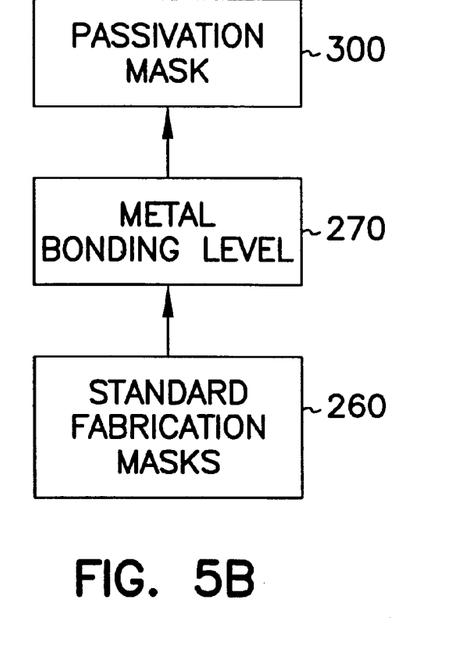
FIG. 5B illustrates a simplified production flow diagram.

A simplified flow diagram of pre-production masks are provided in FIG. 5A. Because each integrated circuit is unique, the numerous standard fabrication masks are illustrated as a single set of masks 260. Each integrated circuit does include a bonding metal mask 270 for wire bonding the integrated circuit to external connections. The additional insulating mask 280 which is used to create vias in the insulating layer, and the probe metal mask 290 are illustrated separately. In production, masks 280 and 290 can be eliminated and replaced with a passivation mask 300, as illustrated in the simplified production flow diagram of FIG. 5B.

Figure 6A:
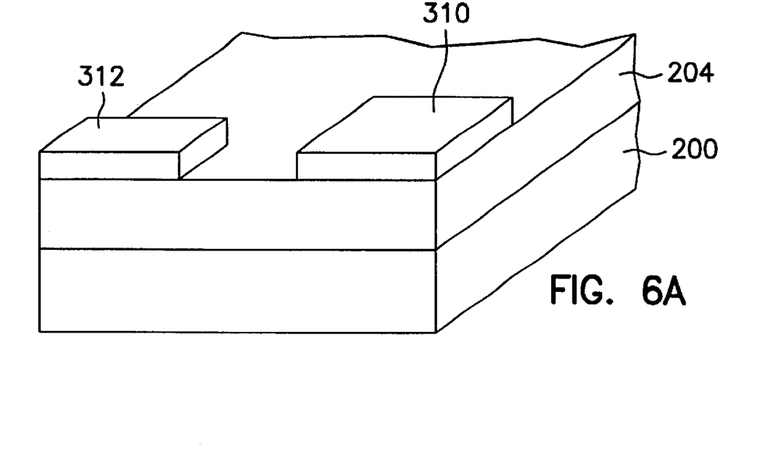
FIGS. 6A–F are three dimensional illustrations of one embodiment of an integrated circuit fabrication.
Figure 6B:
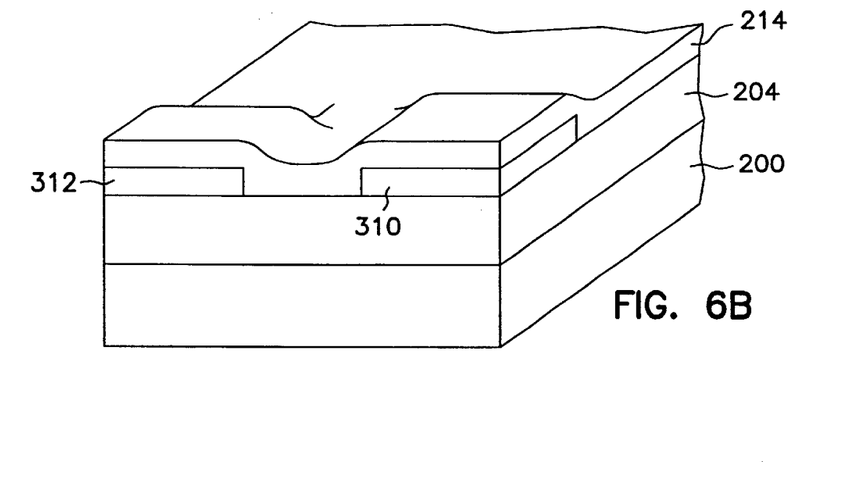
Figure 6C:
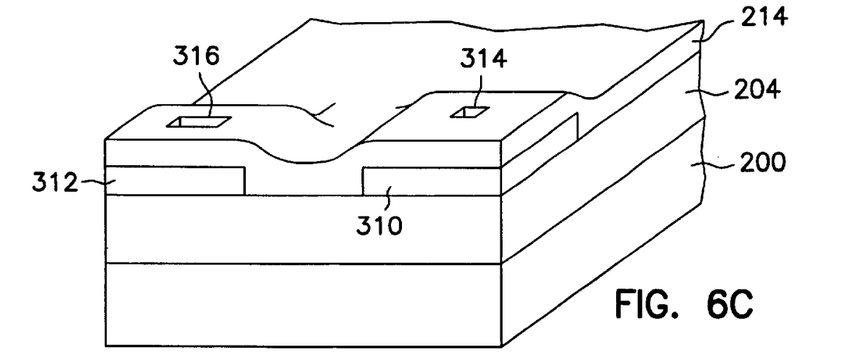
Figure 6D:
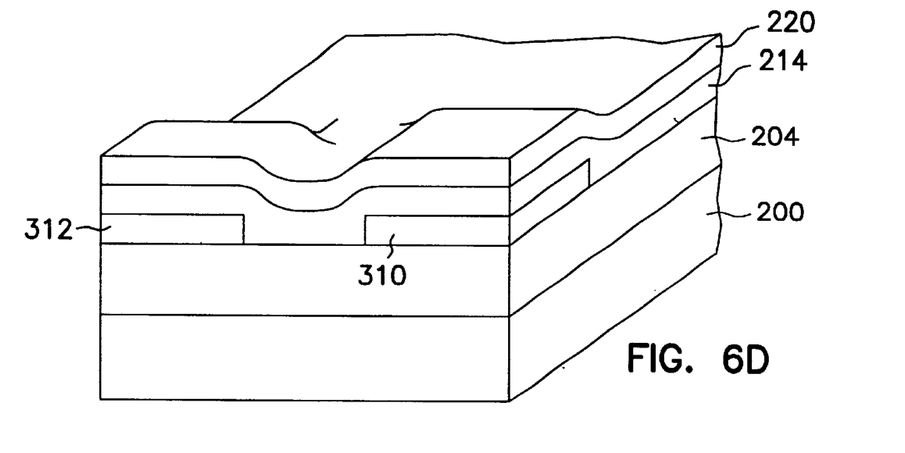
Figure 6E:
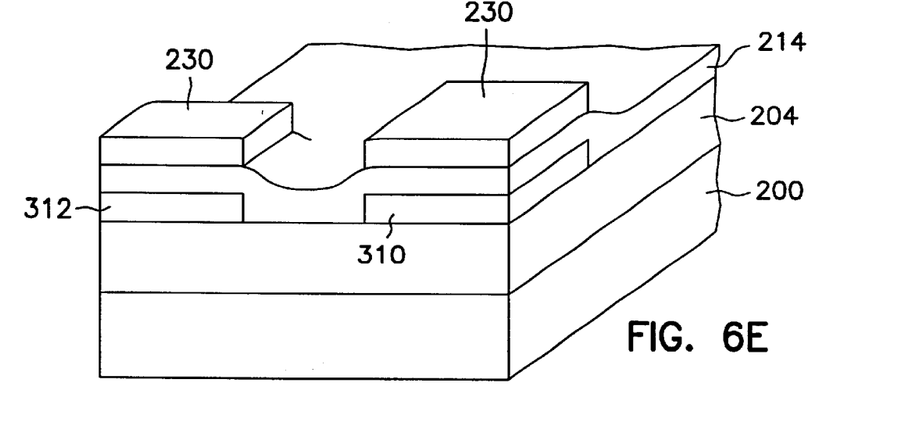
Figure 6F:
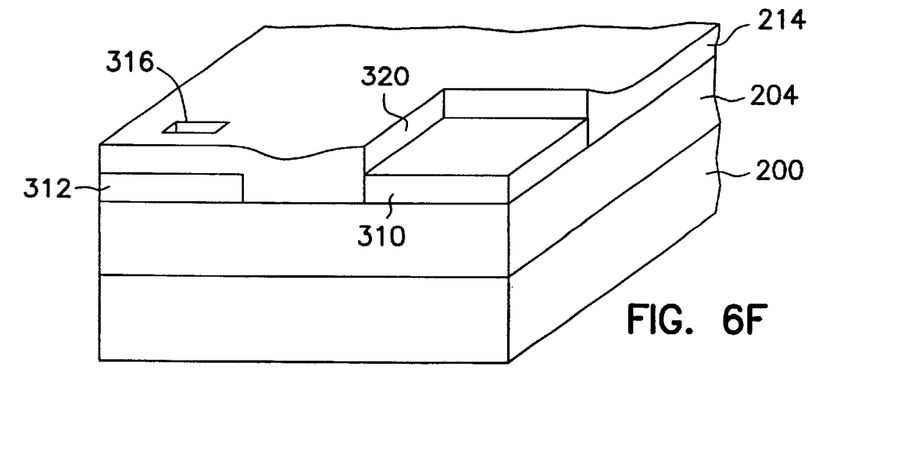

Referring to FIGS. 6A–E, a fabrication of an integrated circuit is illustrated in a series of three-dimensional cross-section perspective views. In FIG. 6A the base 200, or substrate, and multiple integrated circuit layers 204 are the same as generally illustrated in FIGS. 2 and 3. The upper metal layer 208 has been patterned and etched to form bonding pad 310 and conductor line 312. It will be appreciated by those skilled in the art that the bonding pad is sized accordingly to provide enough area to accept a bond wire. As illustrated in FIG. 6B, the insulating layer 214 is fabricated on the top surface of metal layer 208 to cover bond pad 310 and conductor line 312. Pattern and etch steps are performed on the insulating layer to form vias 314 and 316 to the bond pad and the conductor line, see FIG. 6C. Vias 314 and 316 can be provided as a ring of vias on the outside edge of contact 310 or 312 instead of a single via in the middle. This configuration prevents damage to a single via during subsequent processing. After the insulating layer has been etched, metal level 220 is fabricated on the top surface of the insulating layer, as illustrated in FIG. 6D. This metal layer is patterned and etched to form probe pads 230. It will be appreciated by those skilled in the art that probe pads 230 are sized appropriately to provide a landing area for mechanical probes. In an alternate embodiment, as illustrated in FIG. 6F, insulating layer 214 is patterned and etched to form via 316 and via 320. Via 320 is substantially equal in area to the top surface of bond pad 310. When the metal layer 220 is patterned and etched, a larger contact region between probe pad 230 and bond pad 310 is created.

Although it has been described herein as being preferred to eliminate the insulating layer 214 and probe pad level 220 and production processing of the integrated circuit, it will be appreciated that production integrated circuits can include the probe metal level. That is, probe pads 230 can be size accordingly to function as bond pads where necessary. An additional mask step will be required during production processing, however, to include the probe pad level. The above described fabrication is but one example of a method of fabricating in integrated circuit of the present invention, and numerous variations are contemplated for fabricating the integrated circuit. As known to those skilled in the art, a passivation layer can be added on top of probe layer to protect fine conductor lines which may be included in the layer.

Conclusion

An integrated circuit has been described which includes a metal level primarily comprising probe pads for testing the integrated circuit. This additional metal level is isolated from the integrated circuit upper metal level by an insulating layer. This probe metal level is selectively connected to the metal level and other regions of the integrated circuit to form electrical connections. The probe metal level allows for accurate and extensive pre-production testing of the integrated circuit without sacrificing valuable real-estate of the metal level. The probe metal level and the insulating layer are described as useful during pre-production phases and are preferably eliminated during production of the integrated circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating a pre-production integrated circuit, comprising:

fabricating a plurality of semiconductor circuits on a substrate;

fabricating a first metal conductor layer substantially comprising a plurality of wire bonding pads and conductor lines on the substrate and interconnecting the plurality of semiconductor circuits;

fabricating an insulating level on a top surface of the first metal conductor layer and covering the plurality of wire bonding pads and conductor lines;

providing access locations through the insulating level to provide access to at least a portion of the wire bonding pads and at least a portion of the conductor lines of the first metal conductor layer; and fabricating a metal probe level on a top surface of the insulating level, the metal probe level substantially comprising a plurality of electrical probe pads sized to be greater in area than the conductor lines of the first metal conductor layer.

2. The method of claim 1 wherein the step of fabricating the metal probe level simultaneously forms electrical contacts between the metal probe level and the first metal conductor layer through the access locations.

3. The method of claim 1 further comprising the step of fabricating a second metal conductor layer prior to fabricating the first metal conductor layer whereby the second metal conductor layer is below and electrically insulated from the first metal conductor layer.

4. The method of claim 1 wherein the access locations have a lateral surface area substantially equal to a lateral surface area of the wire bonding pads.

5. A method of manufacturing a pre-production integrated circuit memory device without a top passivation layer protection layer, comprising:

fabricating a plurality of semiconductor circuits on a substrate;

forming a first metal level on the substrate, wherein forming the first metal level includes forming the first metal level to substantially include a plurality of conductor lines and bonding pads sized for external connection and interconnecting the plurality of semiconductor circuits;

locating an insulating level on a top surface of the first metal level to cover the plurality of conductor lines and bonding pads;

locating a metal probe level on a top surface of the insulating level;

forming the metal probe level to substantially contain a plurality of electrical probe pads sized to be greater in area than the plurality of conductor lines of the first metal level; and patterning a plurality of access apertures in the insulating level to allow electrical contacts between the plurality of bonding pads of the first metal level and the metal probe level.

6. The method of claim 5, wherein forming the metal probe level includes forming the plurality of electrical probe pads to receive a probe tip.

7. The method of claim 5, wherein forming the metal probe level includes forming the plurality of conductive bonding pads.

8. The method of claim 5, wherein forming the metal probe level includes connecting the plurality of probe pads to a plurality of connecting vias.

9. A method of manufacturing a pre-production integrated circuit memory device without a top passivation layer protection layer, comprising:

fabricating a plurality of semiconductor circuits including an array of memory cells on a substrate;

forming a first metal level on the substrate, wherein forming the first metal level includes forming the first metal level to substantially include a plurality of conductor lines and bonding pads sized for external connection and interconnecting the plurality of semiconductor circuits, wherein forming the first metal level includes forming probe pads located over the array of memory cells;

locating an insulating level on a top surface of the first metal level to cover the plurality of conductor lines and bonding pads;

locating a metal probe level on a top surface of the insulating level;

forming the metal probe level to substantially contain a plurality of electrical probe pads sized to be greater in area than the plurality of conductor lines of the first metal level; and patterning a plurality of access apertures in the insulating level to allow electrical contacts between the plurality of bonding pads of the first metal level and the metal probe level.

10. The method of claim 9, wherein forming the probe pads over the array of memory cells includes providing an electrical connection to the array of memory cells.

11. A method of forming a test wafer, comprising forming a plurality of pre-production integrated circuit devices without a top passivation protection layer, wherein forming each of the pre-production integrated circuit devices includes:

forming a plurality of production semiconductor circuits on a substrate;

fabricating a production metal level to include a plurality of metal interconnect lines interconnecting the semiconductor circuits;

fabricating a plurality of bonding pads in the production metal level connected to a portion of the metal interconnect lines;

locating a pre-production insulating layer located on a top surface of the production metal level such that the pre-production insulating layer covers the metal interconnect lines and the plurality of bonding pads; and forming a plurality of apertures directly over a portion of the metal interconnect lines and directly over a portion of the bonding pads;

locating a pre-production metal probe layer on top of the insulating layer and filling the apertures to form interconnecting vias through the pre-production insulating layer; and forming a plurality of probe pads in the pre-production metal probe layer sized to have an area greater than the conductor lines of the production metal level and connected to at least one of the interconnecting vias.

12. The method of claim 11, wherein forming the plurality of probe pads includes connecting at least a portion of the probe pads to a plurality of the interconnecting vias.

13. The method of claim 11, wherein forming the plurality of probe pads includes connecting a portion of the plurality of probe pads through a metal trace to at least one of the vias.

14. The method of claim 13, wherein forming the plurality of probe pads includes locating each of the portion of the plurality of probe pads directly over the at least one of the vias.

15. A method of forming a prototype flash memory device having probe pads that do not detract from the useable area of a substrate, comprising fabricating a pre-production, not-for-sale memory device without a top passivation protection layer, wherein fabricating includes:

forming a plurality of production semiconductor circuits on the substrate;

fabricating a production metal level on the substrate, wherein fabricating includes forming a plurality of metal interconnect lines on the substrate interconnecting the plurality of production semiconductor circuits and forming a plurality of bonding pads on the substrate connected to the plurality of metal interconnect lines;

fabricating a pre-production insulating layer on a top surface of the production metal level so that the pre-production insulating layer covers the plurality of metal interconnect lines and the plurality of bonding pads;

forming a plurality of apertures aligned over a portion of the plurality of metal interconnect lines and a portion of the plurality of bonding pads;

fabricating a pre-production metal probe level on top of the pre-production insulating layer and filling the apertures to form interconnecting vias thorough the pre-production insulating layer; and forming a plurality of probe pads in the pre-production metal probe level that are sized to be greater in area than the conductor lines of the production metal level and each probe pad being connected to at least one of the interconnecting vias.

16. The method of claim 15, wherein forming the plurality of production semiconductor circuits includes forming an array of memory cells.

17. The method of claim 15, wherein forming the plurality of probe pads includes connecting a portion of the plurality of probe pads to a plurality of interconnecting vias.

18. The method of claim 17, wherein connecting the at least a portion of the plurality of probe pads includes connecting the probe pads to the interconnecting vias through a metal trace.

19. The method of claim 18, wherein forming the plurality of probe pads includes forming each of the plurality of probe pads not directly over the at least one of the interconnecting vias.

20. A method of fabricating an integrated circuit, comprising:

fabricating a plurality of semiconductor circuits on a substrate;

fabricating a first metal conductor layer substantially including a plurality of wire bonding pads and conductor lines on the substrate and interconnecting the plurality of semiconductor circuits;

fabricating an insulating level on a top surface of the first metal conductor layer and covering the plurality of wire bonding pads and conductor lines;

providing access locations through the insulating level to provide access to at least a portion of the wire bonding pads and at least a portion of the conductor lines of the first metal conductor layer;

fabricating a metal probe level on a top surface of the insulating level, the metal probe level substantially including a plurality of electrical probe pads sized to be greater in area than the conductor lines of the first metal conductor layer;

removing the metal probe level; and removing the insulating level.

21. The method of claim 20, further comprising depositing a passivation layer after removing the metal probe level and removing the insulating level.

22. The method of claim 20, wherein fabricating the metal probe level simultaneously forms electrical contacts between the metal probe level and the first metal conductor layer through the access locations.

23. The method of claim 20, further comprising fabricating a second metal conductor layer prior to fabricating the first metal conductor layer wherein the second metal conductor layer is below and electrically insulated from the first metal conductor layer.

24. The method of claim 20, wherein the access locations are formed to have a lateral surface area substantially equal to a lateral surface area of the wire bonding pads.

25. A method of manufacturing an integrated circuit memory device, comprising forming a pre-production integrated circuit memory device without a top passivation layer and forming a production integrated circuit memory device, wherein forming the pre-production integrated circuit memory device includes:

fabricating a plurality of semiconductor circuits on a substrate;

forming a first metal level on the substrate, wherein forming the first metal level includes forming the first metal level to substantially include a plurality of conductor lines and bonding pads sized for external connection and interconnecting the plurality of semiconductor circuits;

locating an insulating level on a top surface of the first metal level to cover the plurality of conductor lines and bonding pads;

locating a metal probe level on a top surface of the insulating level;

forming the metal probe level to substantially contain a plurality of electrical probe pads sized to be greater in area than the plurality of conductor lines of the first metal level; and patterning a plurality of access apertures in the insulating level to allow electrical contacts between the plurality of bonding pads of the first metal level and the metal probe level.

26. The method of claim 25, wherein fabricating the production integrated circuit memory device includes removing the metal probe layer from the pre-production integrated circuit memory device.

27. The method of claim 26, wherein fabricating the production integrated circuit memory device includes removing the insulating level from the pre-production integrated circuit memory device.

28. The method of claim 27, wherein fabricating the production integrated circuit memory device includes fabricating a passivation layer on the substrate.

29. The method of claim 25, wherein forming the metal probe level includes forming the plurality of electrical probe pads to receive a probe tip.

30. The method of claim 25, wherein forming the metal probe level includes forming the plurality of conductive bonding pads.

31. The method of claim 26, wherein forming the metal probe level includes connecting the plurality of probe pads to a plurality of connecting vias.

32. A method of manufacturing an integrated circuit memory device comprising forming a pre-production integrated circuit memory device without a top passivation layer and forming a production integrated circuit memory device, wherein forming the pre-production integrated circuit memory device includes:

fabricating a plurality of semiconductor circuits including an array of memory cells on a substrate;

forming a first metal level on the substrate, wherein forming the first metal level includes forming the first metal level to substantially include a plurality of conductor lines and bonding pads sized for external connection and interconnecting the plurality of semiconductor circuits, wherein forming the first metal level includes forming probe pads located over the array of memory cells;

locating an insulating level on a top surface of the first metal level to cover the plurality of conductor lines and bonding pads;

locating a metal probe level on a top surface of the insulating level;

forming the metal probe level to substantially contain a plurality of electrical probe pads sized to be greater in area than the plurality of conductor lines of the first metal level; and patterning a plurality of access apertures in the insulating level to allow electrical contacts between the plurality of bonding pads of the first metal level and the metal probe level.

33. The method of claim 32, wherein fabricating the production integrated circuit memory device includes removing the metal probe layer from the pre-production integrated circuit memory device.

34. The method of claim 32, wherein fabricating the production integrated circuit memory device includes removing the insulating level from the pre-production integrated circuit memory device.

35. The method of claim 32, wherein fabricating the production integrated circuit memory device includes fabricating a passivation layer on the substrate.

36. The method of claim 32, wherein forming the probe pads over the array of memory cells includes providing an electrical connection to the array of memory cells.

37. A method of forming a prototype flash memory device having probe pads that do not detract from the useable area of a substrate, comprising fabricating a pre-production, not-for-sale memory device without a top passivation protection layer and fabricating a production memory device with the top passivation protection layer, wherein fabricating the pre-production, not-for-sale memory device includes:

forming a plurality of production semiconductor circuits on the substrate;

fabricating a production metal level on the substrate, wherein fabricating includes forming a plurality of metal interconnect lines on the substrate interconnecting the plurality of production semiconductor circuits and forming a plurality of bonding pads on the substrate connected to the plurality of metal interconnect lines;

fabricating a pre-production insulating layer on a top surface of the production metal level so that the pre-production insulating layer covers the plurality of metal interconnect lines and the plurality of bonding pads;

forming a plurality of apertures aligned over a portion of the plurality of metal interconnect lines and a portion of the plurality of bonding pads;

fabricating a pre-production metal probe level on top of the pre-production insulating layer and filling the apertures to form interconnecting vias thorough the pre-production insulating layer; and forming a plurality of probe pads in the pre-production metal probe level that are sized to be greater in area than the conductor lines of the production metal level and each probe pad being connected to at least one of the interconnecting vias.

38. The method of claim 37, wherein fabricating the production memory device includes removing the metal probe layer from the pre-production memory device.

39. The method of claim 37, wherein fabricating the production memory device includes removing the insulating level from the pre-production integrated circuit memory device.

40. The method of claim 37, wherein fabricating the production integrated circuit memory device includes fabricating a passivation layer on the substrate.

41. The method of claim 37, wherein forming the plurality of production semiconductor circuits includes forming an array of memory cells.

42. The method of claim 37, wherein forming the plurality of probe pads includes connecting a portion of the plurality of probe pads to a plurality of interconnecting vias.

43. The method of claim 42, wherein connecting the at least a portion of the plurality of probe pads includes connecting the probe pads to the interconnecting vias through a metal trace.

44. The method of claim 43, wherein forming the plurality of probe pads includes forming each of the plurality of probe pads not directly over the at least one of the interconnecting vias.

45. A method of manufacturing a memory device, comprising:

fabricating a plurality of production semiconductor circuits on a substrate;

fabricating a production metal level on the substrate;

fabricating a pre-production, sacrificial insulating layer on the production metal level;

fabricating a pre-production, sacrificial metal probe layer on the production insulating layer;

testing at least one of the production semiconductor circuits by contacting a probe to the metal probe layer; and if the at least one production semiconductor circuit passes the testing, removing the metal probe layer and the insulating layer and fabricating a top passivation layer on the substrate.

46. The method of claim 45, further comprising discarding the plurality of production semiconductor circuits if the at least one production semiconductor circuit fails the testing.

47. The method of claim 45, wherein fabricating a production metal level on the substrate includes forming a plurality of metal interconnect lines on the substrate interconnecting the plurality of production semiconductor circuits and forming a plurality of bonding pads on the substrate connected to the plurality of metal interconnect lines.

48. The method of claim 47, wherein fabricating a pre-production insulating layer on a top surface of the production metal level so that the pre-production insulating layer covers the plurality of metal interconnect lines and the plurality of bonding pads.

49. The method of claim 48, wherein fabricating the pre-production insulating layer includes forming a plurality of apertures aligned over a portion of the plurality of metal interconnect lines and a portion of the plurality of bonding pads.

50. The method of claim 49, wherein fabricating the pre-production metal probe layer on top of the pre-production insulating layer includes filling the apertures to form interconnecting vias thorough the pre-production insulating layer.

51. The method of claim 50, wherein forming the pre-production metal probe layer includes forming a plurality of probe pads that are sized to be greater in area than the conductor lines of the production metal level and each probe pad being connected to at least one of the interconnecting vias.

* * * * *